(12) United States Patent
Hong et al.

(10) Patent No.: US 10,905,002 B2
(45) Date of Patent: Jan. 26, 2021

(54) METHOD FOR FORMING FLEXIBLE SUBSTRATE INCLUDING VIA, AND FLEXIBLE SUBSTRATE HAVING VIA

(71) Applicant: Seoul National University R&DB Foundation, Seoul (KR)

(72) Inventors: Yongtaek Hong, Seoul (KR); Eunho Oh, Seoul (KR); Junghwan Byun, Seoul (KR); Byeongmoon Lee, Chungcheong buk-do (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 16/476,784

(22) PCT Filed: Sep. 22, 2017

(86) PCT No.: PCT/KR2017/010448
§ 371 (c)(1),
(2) Date: Jul. 9, 2019

(87) PCT Pub. No.: WO2018/128246
PCT Pub. Date: Jul. 12, 2018

(65) Prior Publication Data
US 2019/0380199 A1 Dec. 12, 2019

(30) Foreign Application Priority Data
Jan. 9, 2017 (KR) .................. 10-2017-0003144

(51) Int. Cl.
*H05K 3/40* (2006.01)
*H05K 1/02* (2006.01)
(Continued)

(52) U.S. Cl.
CPC .......... *H05K 1/0283* (2013.01); *H05K 1/115* (2013.01); *H05K 3/361* (2013.01); *H05K 3/4061* (2013.01)

(58) Field of Classification Search
CPC ...... H05K 1/0283; H05K 1/115; H05K 3/361; H05K 3/4061
See application file for complete search history.

(56) References Cited

U.S. PATENT DOCUMENTS

| | | | |
|---|---|---|---|
| 6,168,442 B1 * | 1/2001 | Naoi | H01R 13/2414 439/66 |
| 2002/0061401 A1 * | 5/2002 | Kokubo | H05K 7/1061 428/403 |

(Continued)

FOREIGN PATENT DOCUMENTS

| | | |
|---|---|---|
| JP | 2012-028600 A | 2/2012 |
| KR | 20140076358 A | 1/2000 |

(Continued)

OTHER PUBLICATIONS

U.S. Appl. No. 16/476,784, filed Jul. 9, 2019, Yongtaek Hong.
(Continued)

*Primary Examiner* — Hoa C Nguyen
(74) *Attorney, Agent, or Firm* — Lathrop GPM, LLP

(57) ABSTRACT

A method for forming a flexible substrate having a via, according to the present embodiment, comprises the steps of: (a) arranging a mixture of conductive particles moving by means of a magnetic field, when a curable resin and the magnetic field are provided; (b) forming a material layer being cured and having flexibility; (c) arranging the conductive particles by providing a magnetic field; and (d) curing the curable resin and the material layer.

9 Claims, 4 Drawing Sheets

(51) Int. Cl.
*H05K 1/11* (2006.01)
*H05K 3/36* (2006.01)

(56) References Cited

U.S. PATENT DOCUMENTS

| | | | |
|---|---|---|---|
| 2009/0102064 | A1 | 4/2009 | Sawada et al. |
| 2010/0327232 | A1* | 12/2010 | Yamamoto ............... H01B 1/22 252/500 |
| 2011/0250395 | A1* | 10/2011 | Yamamoto ............. H05K 3/323 428/148 |
| 2013/0168841 | A1 | 7/2013 | Zhao et al. |

FOREIGN PATENT DOCUMENTS

| | | |
|---|---|---|
| KR | 10-1161301 B1 | 7/2012 |
| KR | 10-2014-0038680 A | 3/2014 |
| KR | 10-2014-0076358 A | 6/2014 |
| KR | 10-2015-0004819 A | 1/2015 |
| KR | 10-2015-0077899 A | 7/2015 |
| KR | 10-2015-0138913 A | 12/2015 |
| KR | 10-2016-0136125 A | 11/2016 |

OTHER PUBLICATIONS

U.S. Appl. No. 16/477,081, filed Jul. 19, 2019, Yongtaek Hong.
International Search Report and Written Opinion in related PCT Application No. PCT/KR2017/010448, dated Jan. 19, 2018, with English Translation (17 pages).
International Preliminary Report on Patentability in related PCT Application No. PCT/KR2017/010448, dated Jul. 9, 2019, with English Translation (14 pages).
International Search Report and Written Opinion in related PCT Application No. PCT/KR2018/000333, dated Apr. 27, 2018, with English Translation (28 pages).
International Preliminary Report on Patentability in related PCT Application No. PCT/KR2018/000333, dated Jul. 16, 2019, with English Translation (25 pages).
U.S. Appl. No. 16/477,081, Non-Final Office Action dated Feb. 21, 2020, 15 pages.

\* cited by examiner

[Fig. 1]
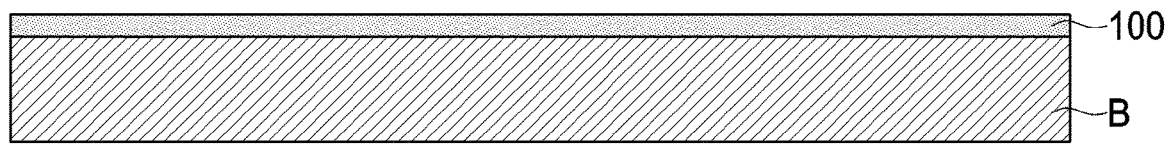
[Fig. 2]
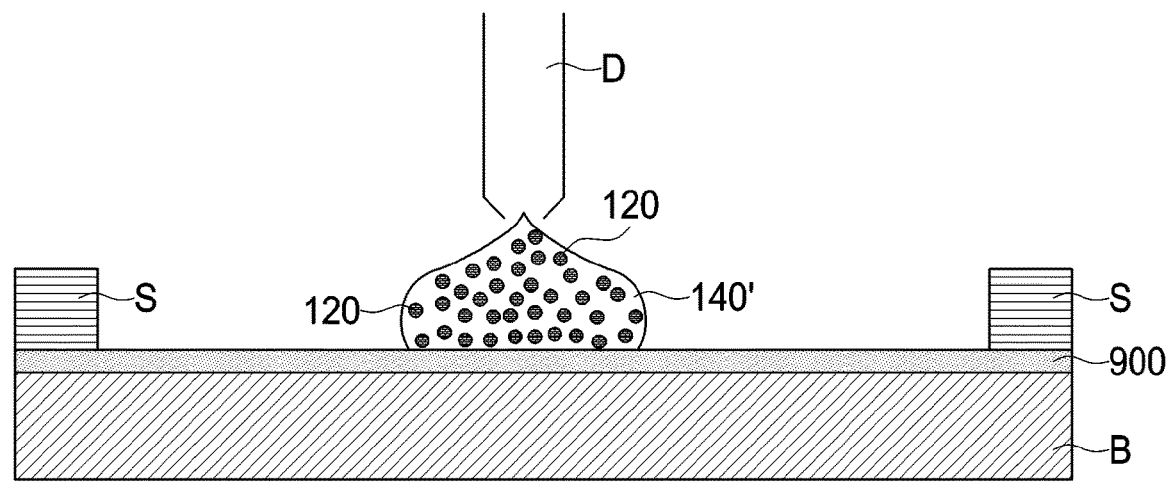
[Fig. 3]
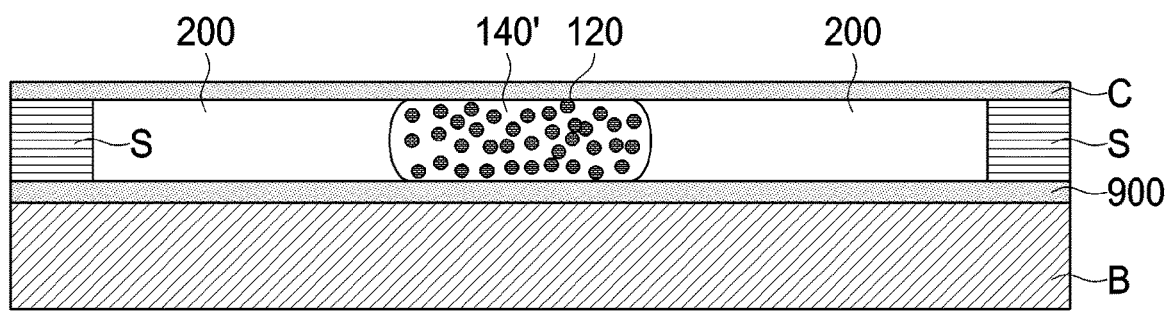

[Fig. 4]
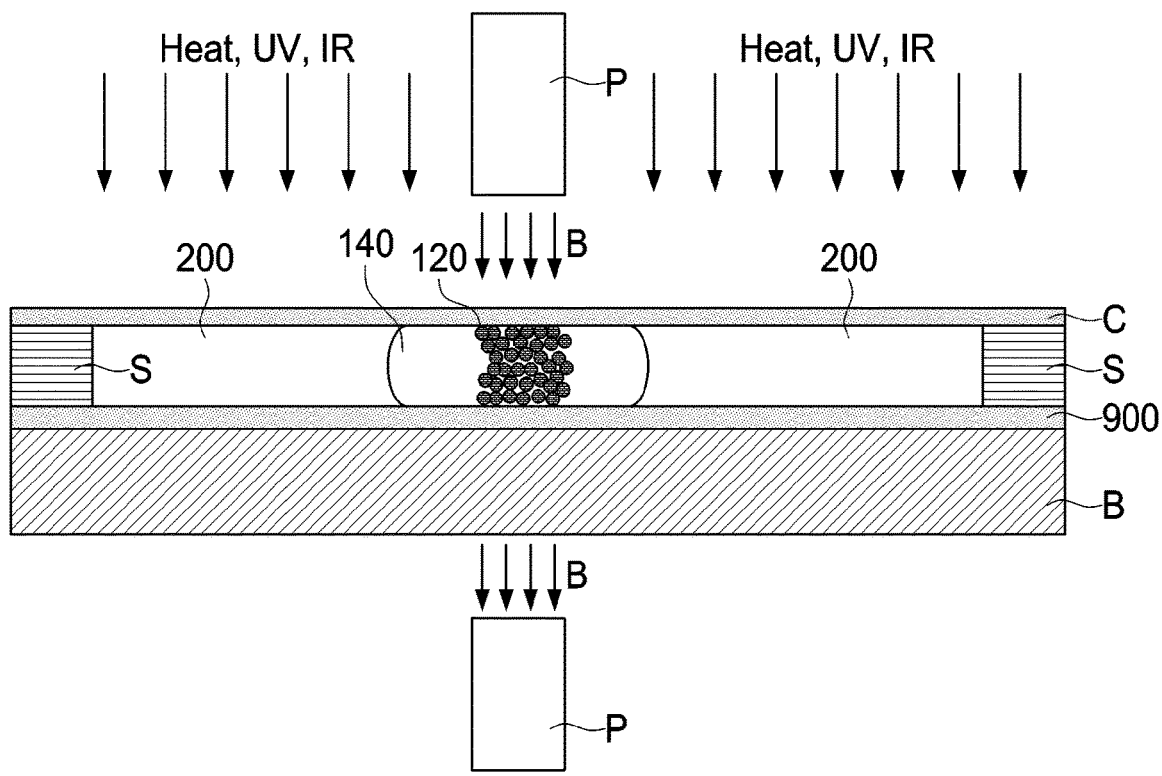
[Fig. 5]
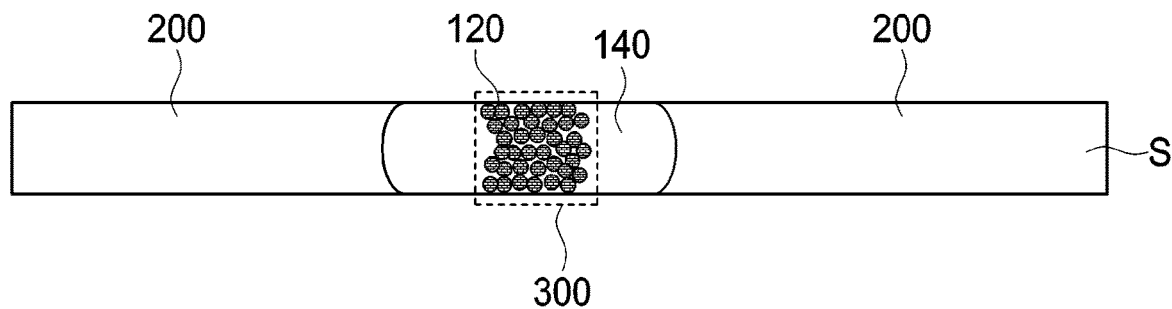

[Fig. 6]
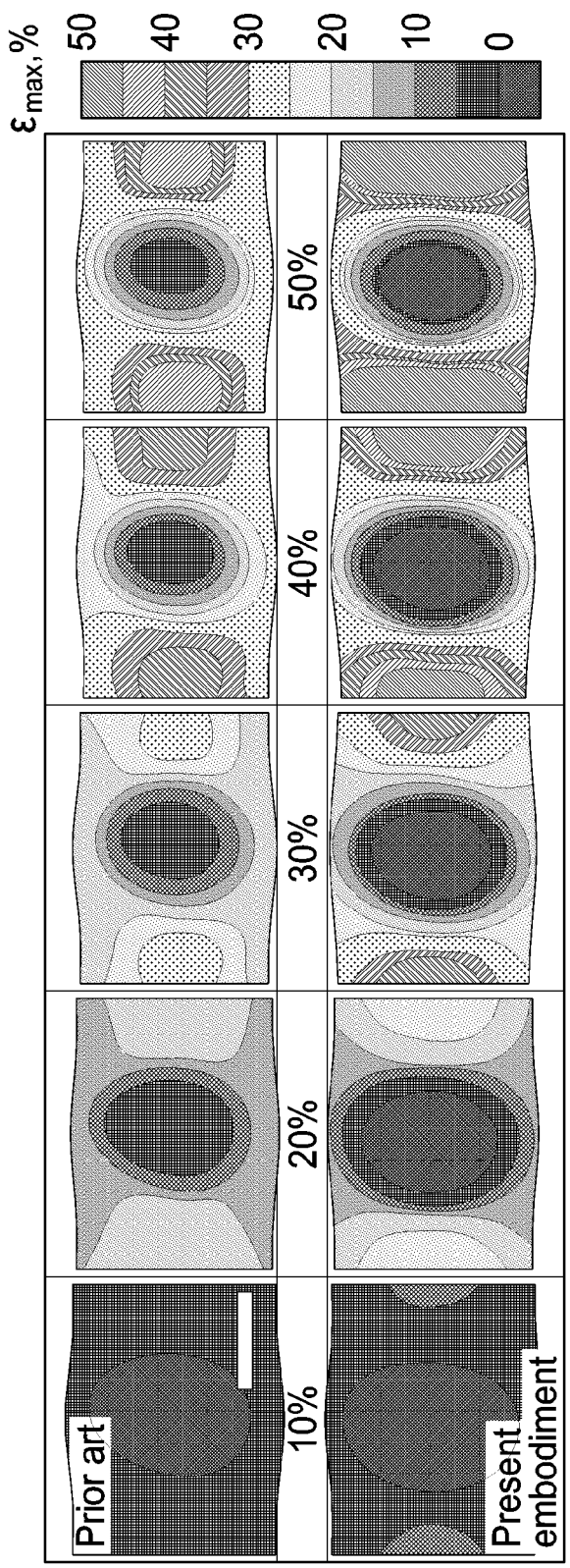

[Fig. 7]
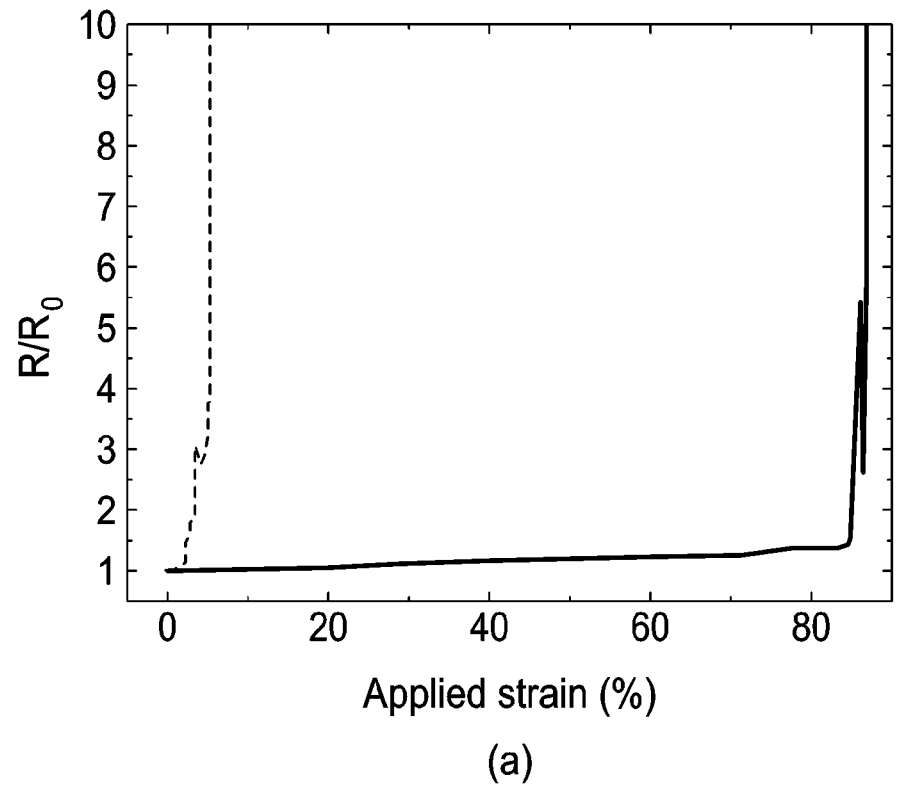
(a)
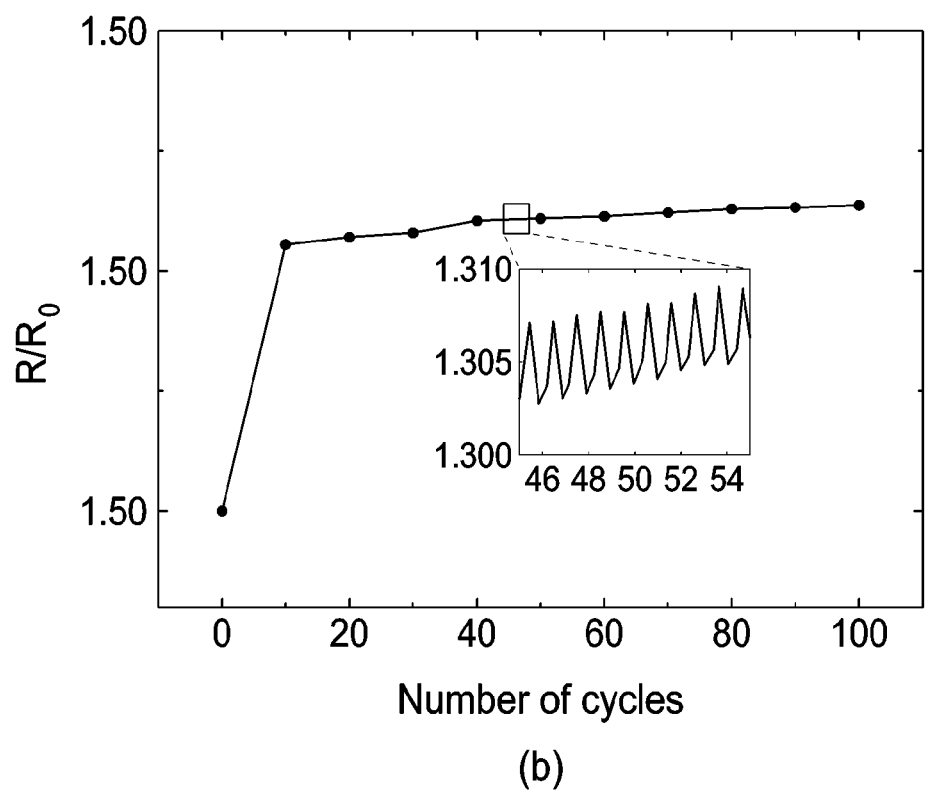
(b)

METHOD FOR FORMING FLEXIBLE SUBSTRATE INCLUDING VIA, AND FLEXIBLE SUBSTRATE HAVING VIA

TECHNICAL FIELD

The present invention relates to a method of forming a stretchable substrate having a via, and a stretchable substrate having a via.

BACKGROUND ART

Recently, wearable electronics or body attachable electronics have been spotlighted. Stretchable substrates are used to implement the wearable electronics or the body attachable electronics. In the conventional stretchable electronic substrates, since electrical interconnections and electronic elements are disposed only on a single plane, there is a spatial limitation in disposing a plurality of electrical interconnections and electronic elements. In order to overcome the spatial limitation and use both surfaces of the stretchable substrate, electrical interconnections and electronic elements of the stretchable electronic substrate are manufactured using vias.

DISCLOSURE

Technical Problem

Conventionally, in order to form a via, a physical hole is formed at a specific position of a stretchable electronic substrate in which a via will be formed and a metal thin film is formed inside or on a surface of the hole. However, a process of forming a via in such a method is very complicated and requires significant manufacturing costs.

Further, due to a difference between a Young's modulus value of a metal thin film filling a hole which is formed to form a via and a Young's modulus value of a stretchable substrate, the stretchable substrate and the metal thin film forming the via are delaminated when a stretching force is applied to the stretchable substrate, and an electrical resistance value of the via is changed according to a magnitude of the stretching force applied to the substrate.

Embodiments of the present invention are intended to solve the problems of the related art described above, and it is an object of the embodiments of the present invention to provide a stretchable substrate having a via which is not delaminated from a stretchable substrate even when a large stretching force is applied to the stretchable substrate as compared to the related art, and a method of manufacturing the same.

In addition, it is one of the main objects of the embodiments of the present invention to provide a stretchable substrate having a via of which a rate of change of electrical resistance is low even when a stretching force is applied to a stretchable substrate, and a method of manufacturing the same.

Technical Solution

One aspect of the present invention provides a method of forming a stretchable substrate having a via, which includes the steps of (a) disposing a mixture of conductive particles which move due to a magnetic field when a curable resin and the magnetic field are provided, (b) forming a material layer, which has stretchability by curing, (c) arranging the conductive particles by providing a magnetic field, and (d) curing the curable resin and the material layer.

Another aspect of the present invention provides a stretchable substrate having a via, which includes a via configured to provide an electrical connection between one surface and the other surface of the stretchable substrate, and a buffer shell positioned between the via and the stretchable substrate and having a Young's modulus value that is greater than a Young's modulus value of the stretchable substrate and smaller than a Young's modulus value of the via.

Advantageous Effects

According to embodiments of the present invention, it is possible to provide a stretchable substrate having a via which is not delaminated from a stretchable substrate even when a large stretching force is applied to the stretchable substrate as compared to the related art, and a method of manufacturing the same.

Further, according to the embodiments of the present invention, it is possible to provide a stretchable substrate having a via of which a rate of change of electrical resistance is low even when a stretching force is applied to a stretchable substrate, and a method of manufacturing the same.

DESCRIPTION OF DRAWINGS

FIGS. 1 to 5 are process cross-sectional views for describing a method of forming a stretchable substrate having a via according to an embodiment.

FIG. 6 shows diagrams for comparing stress distributions by applying the same stretching force to a stretchable substrate having a via according to the related art and a stretchable substrate having a via according to the present embodiment.

FIG. 7A is a graph showing a change in normalized resistance value according to a magnitude of a stretching force applied to the stretchable substrate having a via according to the related art and a change in normalized resistance value according to a magnitude of a stretching force applied to the stretchable substrate having a via according to the present embodiment. FIG. 7B is a graph showing a change in normalized resistance value according to the number of cycles of restoring an original state by applying a stretching force to the stretchable substrate having a via according to the present embodiment.

MODES OF THE INVENTION

The descriptions of the present invention are only exemplary embodiments for structural or functional explanation. Therefore, the scope of the present invention is not to be construed as being limited by the embodiments described in this specification. That is, the embodiments can be modified in various ways and take on various alternative forms, and thus it should be understood that the scope of the present invention covers equivalents capable of realizing the technological scope of invention.

As used herein, the singular forms "a," "an," and "the" are intended to include the plural forms as well, unless the context clearly indicates otherwise. It should be further understood that the terms "comprise," "comprising," "include," and/or "including," when used herein, specify the presence of stated features, numbers, steps, operations, elements, components, and/or combinations thereof, but do not preclude the presence or addition of one or more other features, numbers, steps, operations, elements, components, and/or combinations thereof.

Steps may be performed differently from the specified order unless the context clearly indicates a specific order. That is, steps may be performed in the same order as specified, may be performed substantially concurrently, or may be performed in a reverse order.

Unless otherwise defined, all terms used herein have the same meaning as commonly understood by one of ordinary skill in the art to which this invention belongs. It should be further understood that terms, such as those defined in commonly used dictionaries, are to be interpreted as having a meaning that is consistent with their meaning in the context of the relevant art and are not to be interpreted in an idealized or overly formal sense unless expressly so defined herein.

The drawings referred to for explaining the embodiments of the present invention are exaggerated in size, height, thickness, and the like intentionally for convenience of explanation and understanding, and are not enlarged or reduced in proportion. In addition, any of the elements shown in the drawings may be intentionally reduced and other elements may be intentionally enlarged.

Hereinafter, a method of forming a stretchable substrate having a via according to an embodiment will be described with reference to the accompanying drawings. FIGS. 1 to 5 are process cross-sectional views for describing the method of forming a stretchable substrate having a via according to the present embodiment. Referring to FIG. 1, a sacrificial layer 100 is formed on one surface of a base substrate B.

For example, the sacrificial layer 100 may be formed of a water-soluble polymer or a wet-etchable material layer in the form of a thin film made of a material forming a water-soluble salt and, for example, may be formed as a polyvinyl alcohol layer.

As another example, the sacrificial layer 100 may be formed as a photodecomposible material layer. For example, the sacrificial layer 100 may be formed of a triazine polymer, and the sacrificial layer may be removed by a laser ablation method.

The sacrificial layer may be formed by applying a material constituting the sacrificial layer using a spin coating method, a doctor blade method, a printing method, or the like and then performing heat treatment.

In one embodiment, one surface of a base substrate B may have a hydrophobic property, and it may be difficult to form a sacrificial layer 900 on the hydrophobic surface. In this case, ultraviolet (UV) ray treatment and/or ozone treatment may be performed on the one surface of the base substrate B to modify the hydrophobic surface to a hydrophilic surface.

Referring to FIG. 2, a mixture of a curable resin 140' and conductive particles 120 having a ferromagnetic property is disposed. In one embodiment, the curable resin 140' may be co-cured with the base substrate and bonded to the base substrate and may be a polymer material having a Young's modulus value greater than that of a base substrate in a cured state.

For example, the curable resin may be polymethylphenylsiloxane resin or a polymer in which a polymer chain composed of silicon oxide (Si—O) is substituted with methyl, phenyl, or other functional groups. As another example, the curable resin may be a polymer such as reinforced polydimethylsiloxane (PDMS) and may be reinforced with textiles, fibers, or the like. As still another example, the curable resin may be PDMS to which a higher proportion of a curing agent than a proportion of a base film is added.

In one embodiment, since the curable resin 140' is cured to form a buffer shell 140 (see FIG. 5), the resin 140' forming the buffer shell may be a material which is bonded to the stretchable substrate during the curing process.

In one embodiment, the resin 140' and the conductive particles 120 may be disposed using a dispenser D, as shown in FIG. 2. According to an embodiment not shown, the resin 140' and the conductive particles 120 may be disposed by an inkjet printing method in which the resin 140' and the conductive particles 120 are discharged using a nozzle in a predetermined pattern.

According to another embodiment not shown, the resin 140' and the conductive particles 120 may be disposed by a transfer printing method in which the resin 140' and the conductive particles 120 are buried in a mold having a predetermined pattern formed therein and then transferred to a surface. According to another embodiment not shown, the resin 140' and the conductive particles 120 may be disposed by a printing method such as a gravure printing method in which the resin 140' and the conductive particles 120 are buried in a printing cylinder having a pattern formed therein and are printed in the pattern using a pressurizing cylinder.

In one embodiment, spacers S may be further formed. The spacers S function to adjust a thickness of a stretchable substrate 200 (see FIG. 5) which will be formed in a subsequent process. For example, the spacers S may include a polymer film such as a polyimide film, a Kapton film, or the like.

Referring to FIG. 3, a material layer 200', which has stretchability by curing, is formed. As will be described below, the material layer 200' is cured to form a stretchable substrate. In one embodiment, the material layer 200' may be applied without limitation using any method as long as it can apply a liquid material, such as spin coating, drop casting, blade coating, dispensing, or the like. For example, the material layer 200' may be formed by applying PDMS.

As another example, the material layer 200' may be formed by applying a silicone elastomer polymer having a low Young's modulus value of a siloxane series like Ecoflex, or by applying a thermosetting or photo-curable material capable of stretching and shrinking, such as polyurethane (PU), polyurethane acrylate (PUA), or the like. In one embodiment, a capping layer C may be formed after the material layer 200', which has stretchability by curing, is formed. The material layer 200', which has stretchability by curing, may be formed to have a uniform thickness due to the capping layer C and the spacers S. For example, the capping layer C may be formed as a polyethylene terephthalate (PET) film.

Referring to FIG. 4, conductive particles 120 are arranged by providing a magnetic field B. The conductive particles 120 are particles having a ferromagnetic property as described above. Therefore, the conductive particles 120 move in a direction of the magnetic field B provided from the outside and are arranged in the form of a via 300 (see FIG. 5).

In one embodiment, a material layer 200' and a resin 140' are cured simultaneously with the process of providing the magnetic field B. The material layer 200' is cured to form a stretchable substrate 200. The resin 140' is cured to form a buffer shell 140. As described above, the buffer shell and the stretchable substrate may be bonded to each other during the curing process. The curing process may be performed while providing the magnetic field so that a via may be formed in which the conductive particles 120 are arranged in a direction of the magnetic field.

According to another embodiment not shown, the curing process may be performed after the magnetic field B is provided. For example, after conductive particles 120 having low diffusivity are arranged by providing the magnetic field, the arrangement state is maintained even after the provision of the magnetic field is stopped. Therefore, even when the curing process is performed, the conductive particles 120 may be arranged in the stretchable substrate 200 in the direction of the magnetic field so that a via may be obtained. In one embodiment, the process of curing the material layer 200' and the resin 140' may be performed by providing at least one of heat, UV rays, and infrared rays.

In one embodiment, magnetic fields B may be provided by pole pieces P facing each other. The pole pieces P may be disposed to correspond to positions at which the curable resin 140' and the conductive particles 120 having a ferromagnetic property are disposed so as to form the via in the stretchable substrate, and may provide the magnetic field B.

FIG. 5 is a view of an example of the stretchable substrate 200 separated from the base substrate B. Referring to FIG. 5, after the curing process is completed, the stretchable substrate 200 in which the via 300 is formed is separated from the base substrate B. In one embodiment, the process of separating the stretchable substrate 200 from the base substrate B may be performed using the sacrificial layer 900 (see FIG. 1). For example, when the sacrificial layer is formed of polyvinyl alcohol, the base substrate B and the stretchable substrate 200 may be separated by immersing the base substrate B and the stretchable substrate 200 in water to dissolve the sacrificial layer.

As another example, when the sacrificial layer is formed of a material capable of photodecomposition, the base substrate may be separated by applying a laser thereon (laser ablation) and decomposing the sacrificial layer.

A Young's modulus value of the buffer shell 140 is greater than a Young's modulus value of the stretchable substrate 200. Further, the Young's modulus value of the buffer shell 140 is smaller than a Young's modulus value of the via 300. Further, as described above, the buffer shell 140 and the stretchable substrate 200 are bonded to each other during the curing process.

Therefore, even when a stretching force is applied to the stretchable substrate 200, stress caused by the stretching force is buffered in the buffer shell 140, and even when a large stretching force is applied to the stretchable substrate 200 as compared to the related art, the via 300 is not separated from the stretchable substrate 200 or the via is not destroyed.

Furthermore, even when the stretching force is applied to the stretchable substrate 200, the stress caused by the stretching force is buffered in the buffer shell 140. Therefore, a change in volume of the via 300 is suppressed so that an electrical resistance value of the via 300 is more stably maintained as compared to the related art.

EXPERIMENTAL EXAMPLE

FIG. 6 shows diagrams for comparing stress distributions by applying the same stretching force to a stretchable substrate having a via according to the related art and the stretchable substrate having a via according to the present embodiment. The diagrams in an upper row of FIG. 6 show distributions of stress caused by the stretching force in the case in which the stretching force is applied to the stretchable substrate having a via according to the related art. As shown in the upper row of FIG. 6, it can be seen that stress applied to the inside of the via increases as a magnitude of the applied stretching force increases so that a region under less stress decreases and a region under greater stress increases.

However, according to the present embodiment, it can be seen that the stress applied to the inside of the via is maintained relatively constant because the size of the region of the inside of the via under less stress is not reduced even when the magnitude of the applied stretching force increases. Therefore, it can be seen that the stretchable substrate having a via according to the present embodiment has an advantage in that the stress applied to the inside of the via can be reduced as compared to the related art.

FIG. 7A is a graph showing a change in normalized resistance value according to a magnitude of a stretching force applied to the stretchable substrate having a via according to the related art and a change in normalized resistance value according to a magnitude of a stretching force applied to the stretchable substrate having a via according to the present embodiment. A dashed line of FIG. 7A shows a change of a resistance value in the case in which a stretching force is applied to the stretchable substrate having a via according to the related art, and a solid line shows a change of a resistance value in the case in which a stretching force is applied to the stretchable substrate having a via according to the present embodiment.

As shown in FIG. 7A, it can be seen that, in the related art, when a stretching force of about 10% is applied, the via is destroyed so that the stretchable substrate has a resistance value 10 times or more a resistance value Ro measured in the state in which the stretching force is not applied. Therefore, in the related art, when the stretching force is applied to the stretchable substrate, stable operation of an electronic device and an electronic element formed on the stretchable substrate may not be ensured.

However, in the present embodiment indicated by the solid line, there is only an increase in resistance value to about 1 to 1.5 times a resistance value Ro measured in the state in which no stretching force is applied even when a stretching force ranging from 0% to 80% is applied, and the via is destroyed only when a stretching force of 90% or more is applied so that it can be confirmed that an increase in resistance value occurs. Therefore, it can be seen that, in the stretchable substrate according to the present embodiment, high operational reliability of an electronic device and an electronic element is obtained even when a large stretching force is applied to the stretchable substrate as compared to the related art.

FIG. 7B is a graph showing a change in normalized resistance value according to the number of cycles of restoring an original state by applying a stretching force to the stretchable substrate having a via according to the present embodiment. Referring to FIG. 7B, it can be seen that a resistance value is abruptly changed when a stretching force is first applied to the stretchable substrate one time and then the stretchable substrate is restored to its original state to perform aging thereof.

However, as a result of measuring the resistance value while applying the stretching force ranging from 2 cycles to 100 cycles and restoring the original state, it can be seen that the resistance value is increased to a range of 1.25 times to 1.3 times the measured resistance value Ro measured in the state in which no stretching force is applied. Therefore, it can be seen that the change of the resistance value is stable after one cycle of aging is performed.

While the invention has been described with reference to the exemplary embodiments illustrated in accompanying drawings, these embodiments should be considered in a descriptive sense only, and it should be understood by those skilled in the art that various modifications and equivalent other embodiments may be made. Therefore, the scope of the invention is defined by the appended claims.

INDUSTRIAL APPLICABILITY

Described above.

The invention claimed is:

1. A method of forming a stretchable substrate having a via, the method comprising the steps of:
   (a) disposing a mixture of a curable resin and conductive particles which move due to a magnetic field when the magnetic field are provided;
   (b) forming a material layer which has stretchability when cured
   (c) arranging the conductive particles by providing a magnetic field; and
   (d) curing the curable resin and the material layer;
   wherein, in step (d), the conductive particles are arranged to form the via, the material layer is cured to form the stretchable substrate, and the resin is cured to form a buffer shell, and wherein the curable resin is a polymer material having a Young's modulus greater than the Young's modulus of the stretchable substrate in a cured stated and less than Young's modulus of the via in a cured state.

2. The method of claim 1, wherein, in the step (a), the conductive particles which move due to the magnetic field include ferromagnetic particles.

3. The method of claim 1, wherein the step (a) is performed by dispensing the mixture or by printing the mixture.

4. The method of claim 1, wherein the step (c) is performed by providing the magnetic field such that the conductive particles are arranged to pass through the material layer.

5. The method of claim 1, further comprising, before the step (a) is performed,
   a process of performing a surface treatment on one surface of a base substrate, and
   a process of forming a sacrificial layer on the surface-treated one surface of the base substrate.

6. The method of claim 5, further comprising, after the step (d) is performed, a process of separating the stretchable substrate in which the via is formed from the base substrate by removing the sacrificial layer.

7. The method of claim 1, wherein the step (c) and the step (d) are performed simultaneously.

8. The method of claim 1, further comprising, after the step (b) is performed, a process of forming a capping layer on the material layer.

9. The method of claim 1, wherein the step (d) is performed by providing heat, ultraviolet rays, or infrared rays.

* * * * *